United States Patent [19]

Wozniak

[11] Patent Number: 4,788,510
[45] Date of Patent: Nov. 29, 1988

[54] DIFFERENTIAL INPUT STAGE FOR DIFFERENTIAL LINE RECEIVERS AND OPERATIONAL AMPLIFIERS

[75] Inventor: Ronald J. Wozniak, Allentown, Pa.

[73] Assignee: American Telephone and Telegraph Company, AT&T Bell Laboratories, Murray Hill, N.J.

[21] Appl. No.: 55,679

[22] Filed: May 29, 1987

[51] Int. Cl.$^4$ .............................................. H03F 3/45
[52] U.S. Cl. .................................... 330/253; 307/356
[58] Field of Search ................... 330/253, 257, 258; 307/355, 356, 362, 364, 530; 375/36

[56] References Cited

U.S. PATENT DOCUMENTS

| | | | |
|---|---|---|---|
| 4,371,843 | 2/1983 | Fang et al. | 330/253 |
| 4,379,267 | 4/1983 | Young | 330/253 |
| 4,598,215 | 7/1986 | Schechtman et al. | 307/355 |
| 4,606,012 | 8/1986 | Koshizuka | 307/530 X |
| 4,630,284 | 12/1986 | Cooperman | 375/36 |

FOREIGN PATENT DOCUMENTS

| | | | |
|---|---|---|---|
| 219007 | 12/1984 | Japan | 330/253 |
| 111509 | 6/1985 | Japan | 330/253 |

OTHER PUBLICATIONS

Analysis and Design of Analog Integrated Circuits, Second Edition, Paul R. Gray and Robert G. Meyer, Copyright 1977, 1984 by John Wiley & Sons, Inc.
"Analysis and Design of Analog Integrated Circuits", Second Addition, Paul R. Gray & Robert G. Meyer, pp. 705–709 and 741–744, John Wiley & Sons, 1977 and 1984.

Primary Examiner—James B. Mullins
Attorney, Agent, or Firm—Scott W. McLellan

[57] ABSTRACT

An improved differential input amplifier stage used as the input stage in digital differential line receives or operational amplifiers. The differential input amplifier stage has a pair of input transistors forming a differential pair with a common output node and two complementary output nodes; a current mirror, coupled to the two complementary output nodes and responsive to a first one of the two complementary output nodes and a single-ended output signal on the second one of the two complementary output nodes; and a current source transistor coupled to the common output node and responsive to the first one of the two complementary output nodes. The current source transistor maintains the voltage on the first one of the two complementary output nodes substantially constant, thereby improving common mode and power supply noise immunity and providing faster differential response by the differential input amplifier stage.

9 Claims, 2 Drawing Sheets 4,788,510

DIFFERENTIAL INPUT STAGE FOR DIFFERENTIAL LINE RECEIVERS AND OPERATIONAL AMPLIFIERS

FIELD OF THE INVENTION

This invention relates generally to differential amplifiers, and more particularly, to differential input stages used in digital differential line receivers and operational amplifiers.

BACKGROUND OF THE INVENTION

Differential digital line receivers and operational amplifiers, each using a differential amplifier as an input stage, convert differential input signals, represented by the difference between two input signals, to a non-differential (single-ended) output signal. A conventional differential input stage 10 is diagrammed in FIG. 1 and is similar to that disclosed in "Analysis and Design of Analog Integrated Circuits", by Gray and Meyer, 1984, FIG. 12.31(a), page 742. Stage 10 converts the differential input signal to a single-ended output signal for driving conventional buffer 11. Input transistors 12 and 13, a differential pair, respond to the differential input signal applied to the inputs IN and IN'. Transistors 12 and 13 in turn couple to load transistors 14 and 15 at corresponding nodes N1' and N1, node N1 being the output of stage 10. The source electrodes of load transistors 14 and 15 couple to Vcc, the most positive supply node. The load transistors 14 and 15 are further coupled gate-to-gate and to the drain electrode of transistor 14 at node N1' to form a conventional current mirror. The source electrodes of input transistors 12 and 13 and the input to current source 16 are coupled together at node N2. The output of source 16 couples to Vss, the most negative supply node (usually at ground potential or 0 volts.) An exemplary idle operating condition has Vss at 0 volts and the inputs IN and IN' biased to a bias voltage that is substantially equal one-half of Vcc, or Vcc/2. This condition results in nodes N1 and N1' having substantially the same voltage (Vcc/2) with respect to Vss.

A common mode signal, a signal having substantially equal amplitude and polarity on both inputs IN and IN' with respect to Vss, impressed on the bias voltage on inputs IN and IN' causes node N2 to follow the common mode signal. The voltages on nodes N1 and N1' will not change appreciably in response if the current source 16 is "perfect", i.e., it has an effectively infinite impedance. Such is usually not the case and with the finite impedance of the source 16, the voltage on node N2 does not precisely follow the common mode signal causing current passing through transistors 12 and 13 to vary. This causes some variation in voltage on nodes N1 and N1'. This condition is aggravated with short-channel MOS transistors, transistors having a channel length approaching the thickness of the junction depletion layer of the transistor, adapted to operate as the current source 16 since short-channel MOS transistors have a lower output impedance than long-channel transistors. The current mirror of transistors 14 and 15 reduce the voltage variation on node N1 in response to the common mode signal by counteracting the variation in current passing through transistor 13 with a substantially equal current variation passing through transistor 15 in response to the current passing through transistors 12 and 14. This further reduces the voltage variation on node N1 but not on node N1'. However, operation of the current mirror is not perfect and the voltage variation on node N1 in response to the common mode signal is not completely eliminated.

A small-signal differential input signal impressed on the bias voltage on inputs IN and IN' cause the voltages on nodes N1 and N1' to vary inversely. However, capacitive loading on node N1', caused by the combined capacitance of the gates of transistors 14 and 15, limits the frequency response of the current mirror of transistors 14 and 15, limiting the overall frequency response and speed of stage 10. This capacitive loading of node N1' also increases the common mode signal response of the stage 10 with increasing frequency of the common mode signal since at higher frequencies the current mirror of transistors 14 and 15 cannot fully compensate for the current variations through transistor 13.

Due to the high overall gain (approximately 100) of the stage 10, a large-signal differential input signal exceeding a relatively small predetermined amplitude will cut-off transistors 13 or 15, introducing considerable distortion in the output signal and limiting the dynamic range of the stage 10. This is an overload condition which adds delay to the response time of the stage 10, when the overload condition is removed or reversed in polarity, due to the recovery time necessary for the affected transistors to reestablish the proper operating conditions.

SUMMARY OF THE INVENTION

I disclose herein an improved differential input stage useful in differential digital line receivers and operational amplifiers. The differential input stage has a pair of input transistors forming a differential pair with a common output and two complementary outputs; a current mirror coupled to the two complementary outputs and responsive to a first one of the two complementary outputs, the second one of the two complementary outputs providing a single-ended output signal; and a current source transistor coupled to the common output and responsive to the first one of the two complementary outputs; wherein variations in voltage on the first one of the two complementary outputs, in response to a differential input signal, are minimized. By holding the voltage on the first one of the two complementary outputs substantially constant, the common mode and power supply noise sensitivity of the differential input stage is improved and bandwidth of the stage is increased by removing the frequency response of the current mirror as a limitation on the frequency response of the differential input stage. Also, the dynamic range of the differential input stage is improved, allowing larger input signals before an overload condition occurs. Further, the improved differential input stage is coupled to a plurality of serially coupled digital inverter amplifiers to form a differential line receiver. Alternatively, the improved differential input stage is coupled to a linear amplifier which drives an output buffer to form an operational amplifier.

DETAILED DESCRIPTION

Figure 1:
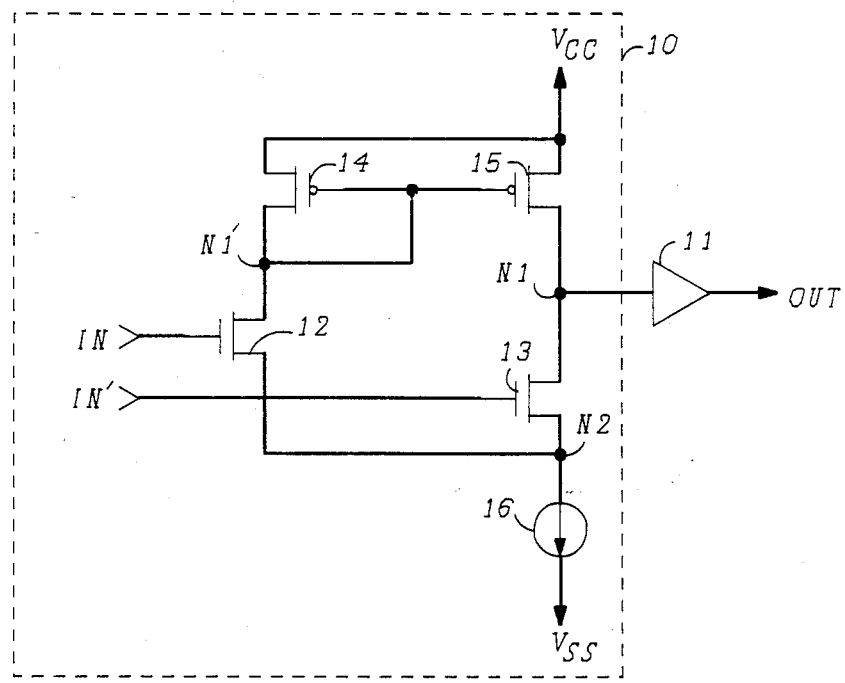
FIG. 1 is a schematic diagram of a conventional differential input amplifier and buffer.
Figure 2:
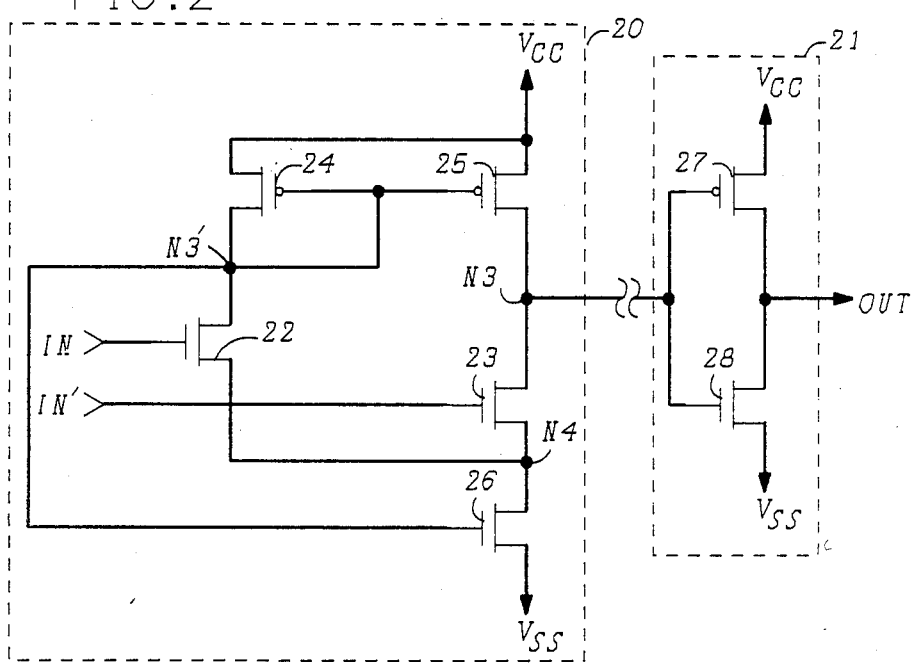
FIG. 2 is a schematic diagram of the improved differential input amplifier and a plurality of serially coupled high speed buffer stages for use as a differential digital line receiver; and, FIG. 3 is a schematic diagram of an operational amplifier using the improved differential input amplifier of FIG. 2.

Referring to FIG. 2, the improved differential input amplifier is shown schematically in a differential digital line receiver embodiment. The improved differential input amplifier, or stage, 20 receives a differential digital signal (also known as a balanced digital signal) via the IN and IN' inputs. Stage 20 converts the differential digital signal to a non-differential, or single-ended, output signal at node N3 for driving buffer 21. The inputs IN and IN' couple to corresponding input transistors 22 and 23, shown here as N-channel enhancement mode transistors forming a differential pair, which in turn couple to load transistors 24 and 25, here P-channel enhancement mode transistors forming a current mirror, at corresponding nodes N3' and N3. The source electrodes of load transistors 24 and 25 couple to Vcc, the most positive supply node. It is understood that all of the transistors can be substituted with corresponding transistors of the opposite conductivity type, making Vcc the most negative supply voltage. The load transistors 24 and 25 are further coupled gate-to-gate and to the drain electrode of transistor 24 at node N3' to form a conventional current mirror. Operation of the current mirror is well understood but, put simply, the electrical characteristics of transistors 24 and 25 are substantially the same so that the conductivity of transistor 25 has substantially the same conductivity as transistor 24 due to the common gate and source electrodes. The conductivity of transistor 24 varies proportionally with the current passing through transistor 24, hence the conductivity of transistor 25 also varies proportionally with the current passing through transistor 24. The source electrodes of input transistors 22 and 23 and the drain electrode of current source transistor 26, an N-channel enhancement mode transistor, are coupled together at node N4. The gate electrode of transistor 26 couples to node N3' and the source electrode of transistor 26 is couples to Vss, the most negative supply node (usually at ground potential or 0 volts.) Negative feedback by transistor 26, being responsive to signals on node N3', reduces the sensitivity of the stage 20 to a common mode signal on the inputs IN and IN' and noise coupled to the stage 20 by the power supplies Vcc and Vss. Without this negative feedback and a suitable bias applied to the gate of transistor 26, transistor 26 would operate as a constant current source, similar to the source 16 (FIG. 1). However, it is noted that current source 16 (FIG. 1) is more than a single transistor such as transistor 26.

An exemplary idle operating condition has Vss at 0 volts and the inputs IN and IN' biased to a bias value that is substantially equal one-half of Vcc, or Vcc/2. This condition yields the best condition for noise immunity, dynamic range and minimum pulse distortion. Therefore, the voltage on nodes N3 and N3' should also be substantially at Vcc/2 for optimal driving of buffer 21. To achieve the proper quiescent voltages, the channel width-to-length ratios of transistors 22, 23, 24, 25 and 26 are chosen such that the equivalent resistances of transistors 24 and 25 are substantially the same as the equivalent resistances of transistors 22 and 23 in series with transistor 26. Exemplary channel width-to-length ratios for the transistors are 80:2 for transistors 24 and 25, 50:2 for transistors 22 and 23, and 110:2 for transistor 26. It is understood that other ratios could be used with various tradeoffs in speed and power dissipation.

Using the above stated exemplary idle operating conditions and transistor size ratios, operation of the differential stage 20 is described herein. The feedback action of transistor 26 substantially reduces the effect of common mode signals applied to inputs IN and IN' on the output signal at node N3. As in the differential input stage of the prior art (FIG. 1), simultaneously varying the voltage on inputs IN and IN' (from the nominal bias voltage, Vcc/2) changes the voltages on nodes N3 and N3' (N1 and N1') due to the change in conductivity of transistors 22 and 23 (12 and 13) by recognizing that transistor 26 (current source 16) is not a "perfect" current source but has significant leakage resistance. The leakage resistance inhibits the voltage on node N4 (N2) from precisely following the voltage variations applied to the inputs IN and IN'. Hence transistors 22 and 23 (12 and 13) "see" varying gate-to-source voltage, thereby changing the conductivity of, and the current passing through, transistors 22 and 23 (12 and 13). As in the prior art (FIG. 1), since the current mirror of transistors 24, 25 (14, 15) cannot fully compensate for the changing current in transistor 23 (13) with the changing current in transistor 22 (12), stage 20 (10) is susceptible to common mode signals. However, transistor 26 responds to the change in voltage on node N3', raising the voltage on node N4 if the voltage on node N3' decreases, and vice-versa. The feedback thereby compensates for the common mode signal on inputs IN and IN' by having the transistor 26 force node N4 to substantially track the variation in the common mode input voltage, decreasing the sensitivity of stage 20 to common mode signals. It is noted that the feedback to transistor 26 also serves to maintain the voltage on node N3' substantially constant, thereby improving immunity of stage 20 to power supply noise on power supplies Vcc or Vss.

With an exemplary small-signal positive differential input signal impressed on the bias voltage (Vcc/2) applied to the inputs IN and IN', i.e., the IN input voltage increases above Vcc/2 and the IN' input voltage decreases below Vcc/2, transistor 22 becomes more conductive while transistor 23 becomes less conductive. Without the feedback to transistor 26, node N3' would decrease in voltage while node N3 would increase in voltage. However, transistor 26 responds to the decrease in voltage on node N3', reducing the conductivity of, and the current through, transistor 26, thereby raising the voltage on node N4. This voltage increase reduces the effective gate-to-source voltage on transistor 24, decreasing the conductivity of, and the current through, transistor 24. This serves to maintain the current passing through transistor 24 and the voltage on node N3' to approximately those of the idle operating condition described above. Further, the conductivity of transistor 25, due to the current mirror effect of transistor 24, also is held to approximately that of the idle operating condition. The increase in the voltage on node N4 effectively decreases the gate-to-source voltage of transistor 23, causing a further decrease in conductivity therein. Therefore, the voltage on node N3 increases while substantially holding the voltage on node N3' constant. Similarly, with an exemplary small-signal negative differential input signal, i.e., the voltage on input IN decreases below Vcc/2 and the voltage on input IN' increases above Vcc/2, transistor 22 becomes less conductive while transistor 23 becomes more conductive. This causes the voltage on node N3' to increase, resulting in transistor 26 becoming more conductive and thereby reducing the voltage on node N4. This increases the effective gate-to-source voltage on transistor 22, causing transistor 22 to conduct more and returning the current passing through, and the voltage on, node N3' to approximately that of the idle condition. The conductivity of transistor 25 also remains substantially unchanged. The increased conduction of transistor 23 is further increased by the decrease in the voltage on node N4, pulling the N3 to a lower voltage while node N3' remains substantially unchanged. Since the voltage on, and the current passing through, node N3' remains substantially invariant with a small-signal input, the frequency response limitation placed on the stage 20 by the current mirror of transistors 24,25 is effectively removed. Further, relatively large input signals can be utilized by the stage 20 before either transistor 23 or 25 is cut-off since the overall gain of the stage 20 is reduced by the operation of transistor 26 to approximately six. The output signal on node N3 is amplified and inverted by a plurality of serially coupled stages 21, here digital inverters, to provide higher drive capability than the stage 20 could provide along. Exemplary channel width-to-length ratios for transistors 27 and 28 for the stage 21 coupling to stage 20 are 40:2 and 10:2, providing a gain of 10 to 3 depending on the amplitude of signals on node N3, the larger gain for smaller signals. Subsequent stages 21 have exemplary channel width-to-length ratios for transistors 27 and 28 of 100:2 and 33:2, 450:2 and 135:2, and 1900:2 and 575:2, respectively.

Figure 3:
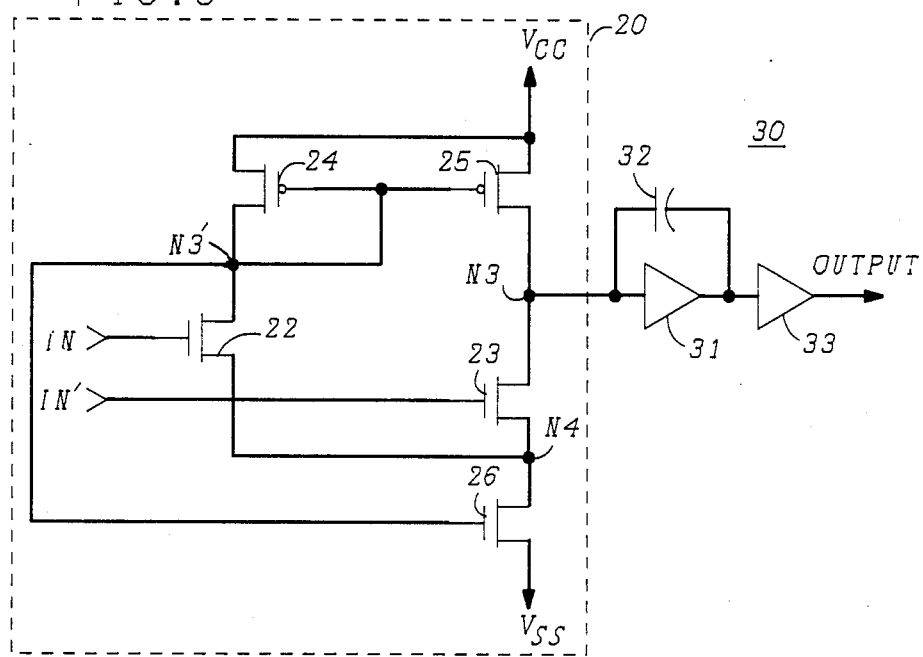

An operational amplifier 30 utilizing the differential input stage 20 (FIG. 2) is diagrammed in FIG. 3. The stage 20 drives a conventional linear gain stage 31 with a compensating capacitor 32 providing feedback for the stage 31. An exemplary stage 31 is the buffer 21 (FIG. 2), but it is understood that any suitable linear amplifier may be used. Capacitor 32 establishes a dominant pole to provide stability to the operational amplifier 30 when the amplifier 30 is operated in a feedback loop. Stage 31 drives a conventional buffer 33 to present a predetermined output impedance and provide output power to a specified load (not shown) coupled to the output of amplifier 30.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. In an integrated circuit, a differential input amplifier stage (20) for converting a differential input signal into a single-ended output signal, having:
   a pair of input transistors (22,23), responsive to the differential input signal, forming a differential pair with a common output node (N4) and two complementary output nodes (N3', N3);
   a current mirror (24,25) having at least two transistors, each in series with the corresponding one of the two complementary output nodes of the differential input stage, the current mirror responsive to a first one of the two complementary output nodes and the second one of the two complementary output nodes having the single-ended output signal; characterized by
   a sink transistor (26), having an output coupled to the common output node of the differential input stage and directly connected to the first one of the two complementary output nodes;
   wherein variations in voltage on the first one of the two complementary output nodes, in response to the differential input signal, are minimized; and
   the transistors are scaled such that the combined equivalent resistance of each input transistor in series with the sink transistor is substantially the same as the equivalent resistance of the corresponding transistor in the current mirror.

2. The differential input stage recited in claim 1, wherein the input and sink transistors are MOS transistors of a first conductivity type and the transistors of the current mirror are MOS transistors of a second conductivity type.

3. A digital differential line receiver, including the differential input stage recited in claim 1, having: a plurality of series coupled amplifier stages (21), responsive to the single-ended output signal from the differential input stage, for amplifying same.

4. The digital differential line receiver recited in claim 5, wherein each one of the amplifier stages is a digital inverter.

5. The digital differential line receiver recited in claim 6, wherein each of the digital inverters has at least two complementary MOS transistors.

6. An operational amplifier (30) having:
   a pair of input transistors (22, 23), responsive to a differential input signal, forming a differential pair with a common output node (N4) and two complementary output nodes (N3', N3);
   a current mirror (24, 25) having at least two transistors, each in series with the corresponding one of the two complementary output nodes of the differential input stage, the current mirror responsive to a first one of the two complementary output nodes and the second one of the two complementary output nodes providing a single-ended output signal;
   an amplifier (31), responsive to the single-ended output signal
   means (32), coupled to the amplifier, for providing same with a pole at a predetermined frequency; and
   an output buffer (33), responsive to the amplifier; characterized by
   a sink transistor (26), having an output coupled to common output node of the differential input stage and directly connected to the first one of the two complementary output nodes;
   wherein variations in voltage on the first one of the two complementary output nodes, in response to the differential input signal, are minimized; and
   the transistors are scaled such that the combined equivalent resistance of each input transistor in series with the sink transistor is substantially the same as the equivalent resistance of the corresponding transistor in the current mirror.

7. The operational amplifier recited in claim 8, wherein the means is a capacitor.

8. The operational amplifier recited in claim 9, wherein at least two of said transistors are complementary MOS transistors.

9. The operational amplifier recited in claim 10, wherein the transistors in the amplifier have coupled control electrodes.

* * * * *